(12) United States Patent
Yasuda et al.

(10) Patent No.: US 12,494,766 B2
(45) Date of Patent: Dec. 9, 2025

(54) ACOUSTIC WAVE DEVICE WITH INTERDIGITAL TRANSDUCER ELECTRODE HAVING BUFFER LAYER

(71) Applicant: Skyworks Solutions, Inc., Irvine, CA (US)

(72) Inventors: Takanori Yasuda, Nara (JP); Keiichi Maki, Suita (JP); Yumi Torazawa, Takatsuki (JP); Rei Goto, Osaka (JP); Michael David Hill, Emmitsburg, MD (US)

(73) Assignee: Skyworks Solutions, Inc., Irvine, CA (US)

( * ) Notice: Subject to any disclaimer, the term of this patent is extended or adjusted under 35 U.S.C. 154(b) by 362 days.

(21) Appl. No.: 18/176,982

(22) Filed: Mar. 1, 2023

(65) Prior Publication Data

US 2023/0361753 A1    Nov. 9, 2023

Related U.S. Application Data

(60) Provisional application No. 63/315,873, filed on Mar. 2, 2022.

(51) Int. Cl.
  *H03H 9/02*    (2006.01)
  *H03H 9/64*    (2006.01)

(52) U.S. Cl.
  CPC .... *H03H 9/02834* (2013.01); *H03H 9/02574* (2013.01); *H03H 9/64* (2013.01)

(58) Field of Classification Search
  CPC ... H03H 9/02834; H03H 9/02574; H03H 9/64

USPC ........................................................ 333/193
See application file for complete search history.

(56) References Cited

U.S. PATENT DOCUMENTS

| | | |
|---|---|---|
| 6,426,583 B1 | 7/2002 | Onishi et al. |
| 6,996,882 B2 | 2/2006 | Onishi et al. |
| 7,898,360 B2 | 3/2011 | Mitani et al. |
| 7,928,633 B2 | 4/2011 | Iwasaki et al. |
| 7,982,365 B2 | 7/2011 | Goto et al. |
| 7,999,437 B2 | 8/2011 | Kamiguchi et al. |
| 8,154,171 B2 | 4/2012 | Nishimura et al. |
| 8,482,184 B2 | 7/2013 | Goto et al. |
| 8,508,101 B2 | 8/2013 | Yamanouchi et al. |
| 8,598,968 B2 | 12/2013 | Seo et al. |
| 8,878,362 B2 | 11/2014 | Cheng |
| 9,124,239 B2 | 9/2015 | Nakayama et al. |
| 9,257,962 B2 | 2/2016 | Ikeuchi et al. |
| 9,325,295 B2 | 4/2016 | Nakayama et al. |

(Continued)

*Primary Examiner* — Andrea Lindgren Baltzell
*Assistant Examiner* — Abigail Amir Yaldo
(74) *Attorney, Agent, or Firm* — Knobbe, Martens, Olson & Bear, LLP

(57) ABSTRACT

An acoustic wave device is disclosed. The acoustic wave device can include a substrate, an interdigital transducer electrode disposed on the substrate, and a temperature compensation layer over the interdigital transducer electrode. The IDT electrode includes a lower layer, an upper layer, and a buffer layer disposed between the lower layer and the upper layer. A modulus of elasticity of the buffer layer is less than a modulus of elasticity of the upper layer. The buffer layer is configured to release stress between the lower layer and the upper layer caused due to a difference between a coefficient of thermal expansion of the lower layer and a coefficient of thermal expansion of the upper layer.

20 Claims, 16 Drawing Sheets

(56) References Cited

U.S. PATENT DOCUMENTS

| | | |
|---|---|---|
| 9,422,621 B2 | 8/2016 | Tiku et al. |
| 9,443,803 B2 | 9/2016 | Cheng |
| 9,473,107 B2 | 10/2016 | Komatsu et al. |
| 9,553,049 B2 | 1/2017 | Cheng |
| 9,576,906 B2 | 2/2017 | Cheng |
| 9,735,249 B2 | 8/2017 | Tiku et al. |
| 10,374,574 B2 | 8/2019 | Bulger |
| 10,559,741 B2 | 2/2020 | Bulger |
| 10,911,020 B2 | 2/2021 | Bulger |
| 10,931,253 B2 | 2/2021 | Ta et al. |
| 11,082,029 B2 | 8/2021 | Kodama et al. |
| 11,165,411 B2 | 11/2021 | Liu et al. |
| 11,251,769 B2 | 2/2022 | Takano et al. |
| 11,349,454 B2 | 5/2022 | Shin et al. |
| 11,368,137 B2 | 6/2022 | Goto et al. |
| 11,387,808 B2 | 7/2022 | Shin et al. |
| 11,394,364 B2 | 7/2022 | Matsuda et al. |
| 11,424,732 B2 | 8/2022 | Shin et al. |
| 11,437,976 B2 | 9/2022 | Kaneda et al. |
| 11,463,069 B2 | 10/2022 | Caron |
| 11,496,111 B2 | 11/2022 | Takano et al. |
| 11,502,662 B2 | 11/2022 | Ta et al. |
| 11,552,614 B2 | 1/2023 | Caron et al. |
| 11,563,418 B2 | 1/2023 | Caron |
| 11,581,870 B2 | 2/2023 | Takano et al. |
| 11,606,078 B2 | 3/2023 | Tang et al. |
| 11,616,487 B2 | 3/2023 | Nakamura et al. |
| 11,616,491 B2 | 3/2023 | Tang et al. |
| 11,621,690 B2 | 4/2023 | Fukuhara et al. |
| 11,652,462 B2 | 5/2023 | Ta et al. |
| 11,689,178 B2 | 6/2023 | Nakamura et al. |
| 11,705,883 B2 | 7/2023 | Hiramatsu et al. |
| 11,705,886 B2 | 7/2023 | Komatsu et al. |
| 11,742,829 B2 | 8/2023 | Komatsu et al. |
| 11,791,793 B2 | 10/2023 | Sun et al. |
| 11,799,439 B2 | 10/2023 | Ta et al. |
| 11,799,445 B2 | 10/2023 | Kodama et al. |
| 11,799,447 B2 | 10/2023 | Kaneda et al. |
| 11,811,385 B2 | 11/2023 | Takano et al. |
| 11,848,658 B2 | 12/2023 | Hiramatsu et al. |
| 11,855,603 B2 | 12/2023 | Matsuda et al. |
| 11,876,501 B2 | 1/2024 | Fukuhara et al. |
| 11,881,837 B2 | 1/2024 | Caron et al. |
| 11,894,828 B2 | 2/2024 | Nakamura et al. |
| 11,909,377 B2 | 2/2024 | Caron et al. |
| 11,909,378 B2 | 2/2024 | Caron et al. |
| 11,923,822 B2 | 3/2024 | Maki et al. |
| 11,923,824 B2 | 3/2024 | Caron |
| 2011/0063047 A1 | 3/2011 | Okuda |
| 2013/0026881 A1 | 1/2013 | Okamoto et al. |
| 2013/0200960 A1* | 8/2013 | Sauer .................. H03H 9/1452 216/13 |
| 2017/0026026 A1 | 1/2017 | Toyota |
| 2017/0186694 A1 | 6/2017 | Cheng |
| 2019/0207583 A1* | 7/2019 | Miura ................. H03H 9/02866 |
| 2020/0028479 A1 | 1/2020 | Ta et al. |
| 2020/0028493 A1 | 1/2020 | Ta et al. |
| 2020/0389151 A1 | 12/2020 | Goto |
| 2021/0111688 A1 | 4/2021 | Abbott et al. |
| 2021/0111689 A1 | 4/2021 | Abbott et al. |
| 2021/0119607 A1 | 4/2021 | Takano et al. |
| 2021/0119608 A1 | 4/2021 | Takano et al. |
| 2021/0152151 A1 | 5/2021 | Takano et al. |
| 2021/0159876 A1 | 5/2021 | Maki et al. |
| 2022/0014177 A1 | 1/2022 | Liu et al. |
| 2022/0158610 A1 | 5/2022 | Goto et al. |
| 2022/0158612 A1 | 5/2022 | Goto et al. |
| 2022/0209738 A1 | 6/2022 | Torazawa et al. |
| 2022/0244301 A1 | 8/2022 | Xu et al. |
| 2022/0286105 A1 | 9/2022 | Goto et al. |
| 2022/0321088 A1 | 10/2022 | Goto et al. |
| 2022/0321096 A1 | 10/2022 | Goto et al. |
| 2022/0329227 A1 | 10/2022 | Goto et al. |
| 2022/0368311 A1 | 11/2022 | Shin et al. |
| 2022/0399867 A1 | 12/2022 | Goto et al. |
| 2022/0399871 A1 | 12/2022 | Goto et al. |
| 2023/0008248 A1 | 1/2023 | Komatsu et al. |
| 2023/0009576 A1 | 1/2023 | Komatsu et al. |
| 2023/0010291 A1 | 1/2023 | Komatsu et al. |
| 2023/0013597 A1 | 1/2023 | Goto et al. |
| 2023/0031568 A1 | 2/2023 | Tang et al. |
| 2023/0083961 A1 | 3/2023 | Komatsu et al. |
| 2023/0095556 A1 | 3/2023 | Komatsu et al. |
| 2023/0096749 A1 | 3/2023 | Komatsu et al. |
| 2023/0110477 A1 | 4/2023 | Maki et al. |
| 2023/0111032 A1 | 4/2023 | Goto et al. |
| 2023/0111849 A1 | 4/2023 | Maki et al. |
| 2023/0113099 A1 | 4/2023 | Goto et al. |
| 2023/0113584 A1 | 4/2023 | Chang et al. |
| 2023/0163746 A1 | 5/2023 | Caron et al. |
| 2023/0208385 A1 | 6/2023 | Hiramatsu et al. |
| 2023/0208396 A1 | 6/2023 | Hiramatsu et al. |
| 2023/0208398 A1 | 6/2023 | Goto et al. |
| 2023/0208399 A1 | 6/2023 | Goto et al. |
| 2023/0223919 A1 | 7/2023 | Goto et al. |
| 2023/0223930 A1 | 7/2023 | Ikeuchi |
| 2023/0223963 A1 | 7/2023 | Ikeuchi |
| 2023/0225212 A1 | 7/2023 | Goto et al. |
| 2023/0275565 A1 | 8/2023 | Tang et al. |
| 2023/0283254 A1 | 9/2023 | Ta et al. |
| 2023/0283255 A1 | 9/2023 | Nakamura et al. |
| 2023/0291385 A1 | 9/2023 | Okamoto et al. |
| 2023/0308081 A1 | 9/2023 | Tang et al. |
| 2023/0318566 A1 | 10/2023 | Yasuda et al. |
| 2023/0327635 A1 | 10/2023 | Hill et al. |
| 2023/0336145 A1 | 10/2023 | Goto et al. |
| 2023/0336146 A1 | 10/2023 | Feld et al. |
| 2023/0336147 A1 | 10/2023 | Feld et al. |
| 2023/0336152 A1 | 10/2023 | Goto et al. |
| 2023/0336153 A1 | 10/2023 | Goto et al. |
| 2023/0344403 A1 | 10/2023 | Goto et al. |
| 2023/0344406 A1 | 10/2023 | Torazawa et al. |
| 2023/0344407 A1 | 10/2023 | Torazawa et al. |
| 2023/0344408 A1 | 10/2023 | Torazawa et al. |
| 2023/0344410 A1 | 10/2023 | Goto et al. |
| 2023/0344411 A1 | 10/2023 | Chen et al. |
| 2023/0344415 A1 | 10/2023 | Chen et al. |
| 2023/0344416 A1 | 10/2023 | Chen et al. |
| 2023/0353119 A1 | 11/2023 | Hill et al. |
| 2023/0387887 A1 | 11/2023 | Komatsu et al. |
| 2023/0403939 A1 | 12/2023 | Goto et al. |
| 2024/0007079 A1 | 1/2024 | Goto et al. |
| 2024/0048125 A1 | 2/2024 | Goto et al. |
| 2024/0063770 A1 | 2/2024 | Sun et al. |
| 2024/0072758 A1 | 2/2024 | Takano et al. |
| 2024/0088862 A1 | 3/2024 | Ta et al. |
| 2024/0088865 A1 | 3/2024 | Matsuda et al. |
| 2024/0088867 A1 | 3/2024 | Kaneda et al. |
| 2024/0258994 A1 | 8/2024 | Steiner et al. |

* cited by examiner

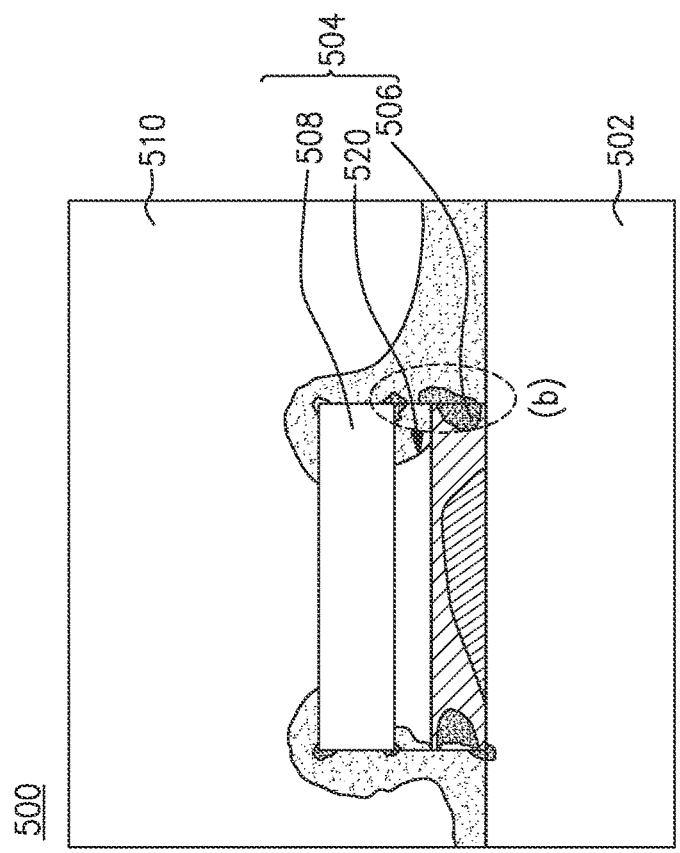
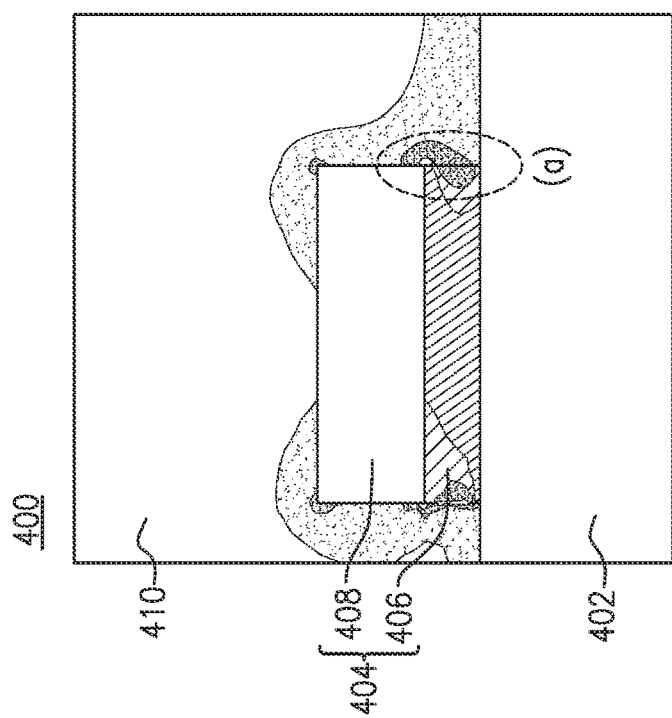
FIG. 6A
FIG. 6B

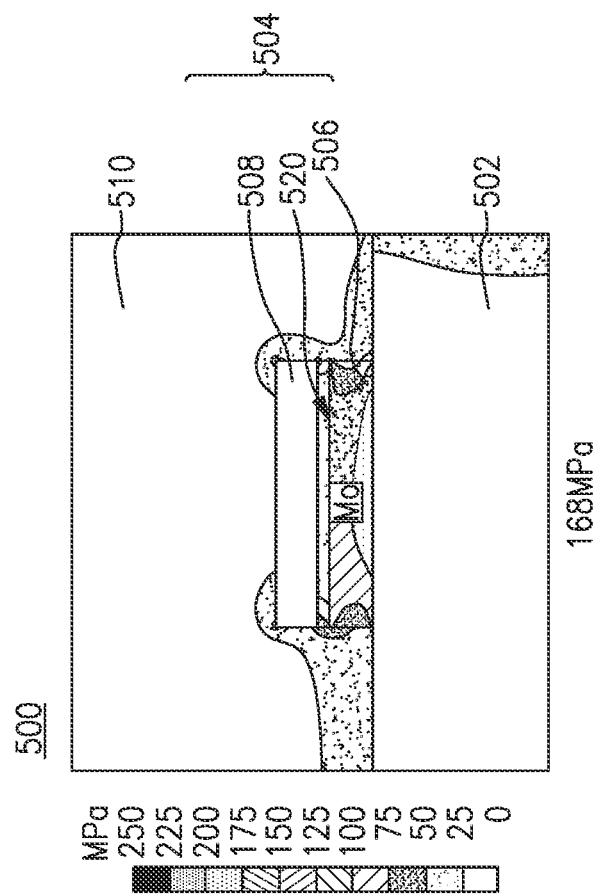
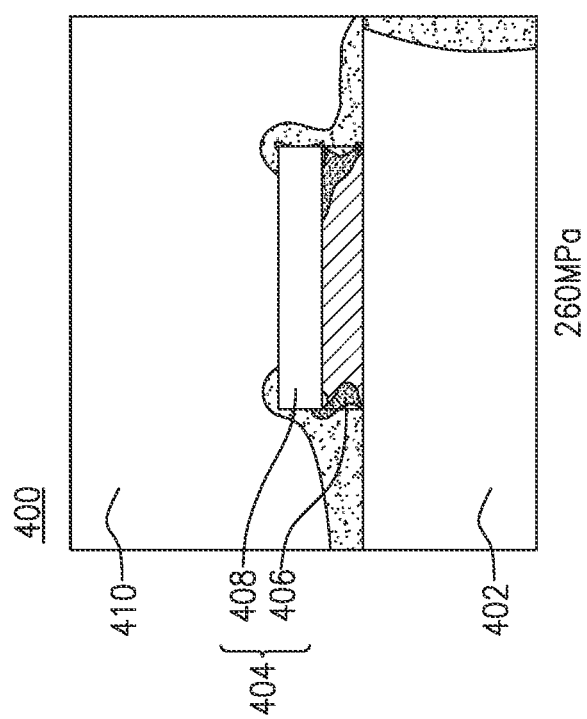
FIG.7A-2
FIG.7A-1

ACOUSTIC WAVE DEVICE WITH INTERDIGITAL TRANSDUCER ELECTRODE HAVING BUFFER LAYER

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of priority of U.S. Provisional Application No. 63/315,873, filed Mar. 2, 2022, titled "ACOUSTIC WAVE DEVICE WITH IMPROVED RELIABILITY," the disclosures of which is hereby incorporated by reference in its entirety and for all purposes.

BACKGROUND

Field

Embodiments of the invention relate to acoustic wave devices, and in particular, to temperature compensated surface acoustic wave devices.

Description of the Related Technology

Filters are used in radio frequency (RF) communication systems to allow signals to pass through at discreet frequencies but reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and bulk acoustic wave (BAW) filters. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter modules include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a substrate, an interdigital transducer electrode disposed on the substrate, and a temperature compensation layer over the interdigital transducer electrode. The interdigital transducer electrode includes a lower layer, an upper layer, and a buffer layer disposed between the lower layer and the upper layer. A modulus of elasticity of the buffer layer is less than a modulus of elasticity of the upper layer. The buffer layer is configured to release stress between the lower layer and the upper layer caused due to a difference between a coefficient of thermal expansion of the lower layer and a coefficient of thermal expansion of the upper layer.

In one embodiment, the modulus of elasticity of the buffer layer is less than a modulus of elasticity of the lower layer.

In one embodiment, the acoustic wave device further includes an intermetallic layer between the buffer layer and the upper layer.

In one embodiment, the buffer layer has a first temperature coefficient of expansion value less than a second temperature coefficient of expansion value of the upper layer.

In one embodiment, the buffer layer has a first temperature coefficient of expansion value larger than a third temperature coefficient of expansion value of the lower layer.

In one embodiment, the buffer layer includes titanium (Ti).

In one embodiment, the upper layer includes at least one of aluminium (Al), copper (Cu), silver (Ag), and gold (Au).

In one embodiment, the lower layer includes at least one of molybdenum (Mo), tungsten (W), and platinum (Pt).

In one embodiment, the thickness of the buffer layer is more than 20 nm and less than 1000 nm.

In one embodiment, a thickness of the upper layer is less than 500 nm, and a thickness of the lower layer is less than 500 nm.

In one embodiment, the interdigital transducer electrode further includes an adhesion layer between the upper layer and the buffer layer.

In one aspect, a radio frequency module is disclosed. The radio frequency module can include a packaging board that is configured to receive a plurality of components, and an acoustic wave device mounted on the packaging board. The acoustic wave device includes a substrate, an interdigital transducer electrode disposed on the substrate, and a temperature compensation layer over the interdigital transducer electrode. The interdigital transducer electrode includes a lower layer, an upper layer, and a buffer layer disposed between the lower layer and the upper layer. A modulus of elasticity of the buffer layer being less than a modulus of elasticity of the upper layer. The buffer layer is configured to release stress between the lower layer and the upper layer caused due to a difference between a coefficient of thermal expansion of the lower layer and a coefficient of thermal expansion of the upper layer.

In one embodiment, the buffer layer has a first temperature coefficient of expansion value that is less than a second temperature coefficient of expansion value of the upper layer.

In one embodiment, wherein the first temperature coefficient of expansion value of the buffer layer is larger than a third temperature coefficient of expansion value of the lower layer.

In one embodiment, the buffer layer includes titanium (Ti).

In one embodiment, the upper layer includes at least one of aluminium (Al), copper (Cu), silver (Ag), and gold (Au), and the lower layer includes at least one of molybdenum (Mo), tungsten (W), and platinum (Pt).

In one embodiment, the thickness of the buffer layer is more than 20 nm and less than 1000 nm.

In one aspect, a mobile device comprising is disclosed. The mobile device can include an antenna that is configured to receive a radio frequency signal, and a front end system that is configured to communicate with the antenna. The front end system includes an acoustic wave device that includes a substrate, an interdigital transducer electrode disposed on the substrate, and a temperature compensation layer. The interdigital transducer electrode includes a lower layer, an upper layer, and a buffer layer disposed between the lower layer and the upper layer. A modulus of elasticity of the buffer layer is less than a modulus of elasticity of the upper layer. The buffer layer is configured to release stress between the lower layer and the upper layer caused due to a difference between a coefficient of thermal expansion of the lower layer and a coefficient of thermal expansion of the upper layer.

In one embodiment, the buffer layer has a first modulus of elasticity less than a third modulus of elasticity of the lower layer.

In one embodiment, the buffer layer has a first temperature coefficient of expansion value less than a second temperature coefficient of expansion value of the upper layer.

In one aspect, a temperature compensated surface acoustic wave device is disclosed. The surface acoustic wave device can include a piezoelectric layer, an interdigital transducer electrode over the piezoelectric layer, and a temperature compensation layer over the interdigital transducer electrode. The interdigital transducer electrode including a first layer, a second layer over the first layer, and a buffer layer between the first layer and the second layer. A thermal conductivity of the second layer is greater than a thermal conductivity of the buffer layer. A thickness of the buffer layer being in a range of 20 nm to 200 nm.

In one embodiment, the piezoelectric layer is a lithium niobate layer having a cut angle in a range of 116° to 134° and a thickness in a range of 100 μm and 350 μm.

In one embodiment, the thermal conductivity of the buffer layer is greater than a thermal conductivity of the first layer.

In one embodiment, the interdigital transducer electrode has a tapered sidewall. A width of the first layer can be greater than a width of the second layer.

In one embodiment, a thickness of the buffer layer is in a range of 20 nm to 100 nm.

In one embodiment, a thickness of the buffer layer is in a range of 5% to 30% of a thickness of the interdigital transducer electrode.

In one embodiment, a thickness of the buffer layer is a titanium layer or a chromium layer.

In one aspect, a temperature compensated surface acoustic wave device is disclosed. The acoustic wave device can include a piezoelectric layer, an interdigital transducer electrode over the piezoelectric layer, and a temperature compensation layer over the interdigital transducer electrode. The interdigital transducer electrode includes a first layer, a second layer over the first layer, and a titanium buffer layer between the first layer and the second layer. A thickness of the titanium buffer layer being in a range of 20 nm to 200 nm.

In one embodiment, the piezoelectric layer is a lithium niobate layer having a cut angle in a range of 116° to 134° and a thickness in a range of 100 μm and 350 μm.

In one embodiment, the first layer is a molybdenum layer, a tungsten layer, or a platinum layer, and the second layer is an aluminum layer.

In one embodiment, the interdigital transducer electrode has a tapered sidewall, and a width of the first layer is greater than a width of the second layer.

In one embodiment, a thickness of the titanium buffer layer is in a range of 20 nm to 100 nm.

In one embodiment, a thickness of the titanium buffer layer is in a range of 5% to 30% of a thickness of the interdigital transducer electrode.

In one aspect, a temperature compensated surface acoustic wave device is disclosed. The acoustic wave device can include a piezoelectric layer, an interdigital transducer electrode over the piezoelectric layer, and a temperature compensation layer over the interdigital transducer electrode. The interdigital transducer electrode includes a first layer, a second layer over the first layer, and a buffer layer between the first layer and the second layer. A thermal conductivity of the second layer is greater than a thermal conductivity of the buffer layer. A thickness of the buffer layer is in a range of 5% to 30% of a thickness of the interdigital transducer electrode.

In one embodiment, the piezoelectric layer is a lithium niobate layer having a cut angle in a range of 116° to 134° and a thickness in a range of 100 μm and 350 μm.

In one embodiment, the first layer is a molybdenum layer, a tungsten layer, or a platinum layer, and the second layer is an aluminum layer.

In one embodiment, the interdigital transducer electrode has a tapered sidewall, and a width of the first layer is greater than a width of the second layer.

In one embodiment, a thickness of the buffer layer is in a range of 20 nm to 200 nm.

In one embodiment, a thickness of the buffer layer is a titanium layer or a chromium layer.

The present disclosure relates to U.S. patent application Ser. No. 18/176,974, titled "TEMPERATURE COMPENSATED ACOUSTIC WAVE DEVICE WITH MULTI-LAYER INTERDIGITAL TRANSDUCER ELECTRODE INCLUDING BUFFER LAYER," filed on even date herewith, the entire disclosure of which is hereby incorporated by reference herein.

BRIEF DESCRIPTION OF THE DRAWINGS

FIG. 6A shows a measured stress distribution in the acoustic wave device of Figure.

FIG. 6B shows a measured stress distribution in an acoustic wave device according to an embodiment.

FIGS. 7A-1 to 7C-2 show simulated stress distributions in different acoustic wave devices.

FIGS. 8A-1 to 8C-2 are graphs showing simulated stress distributions in different acoustic wave devices

DETAILED DESCRIPTION OF EMBODIMENTS

Figure 1:
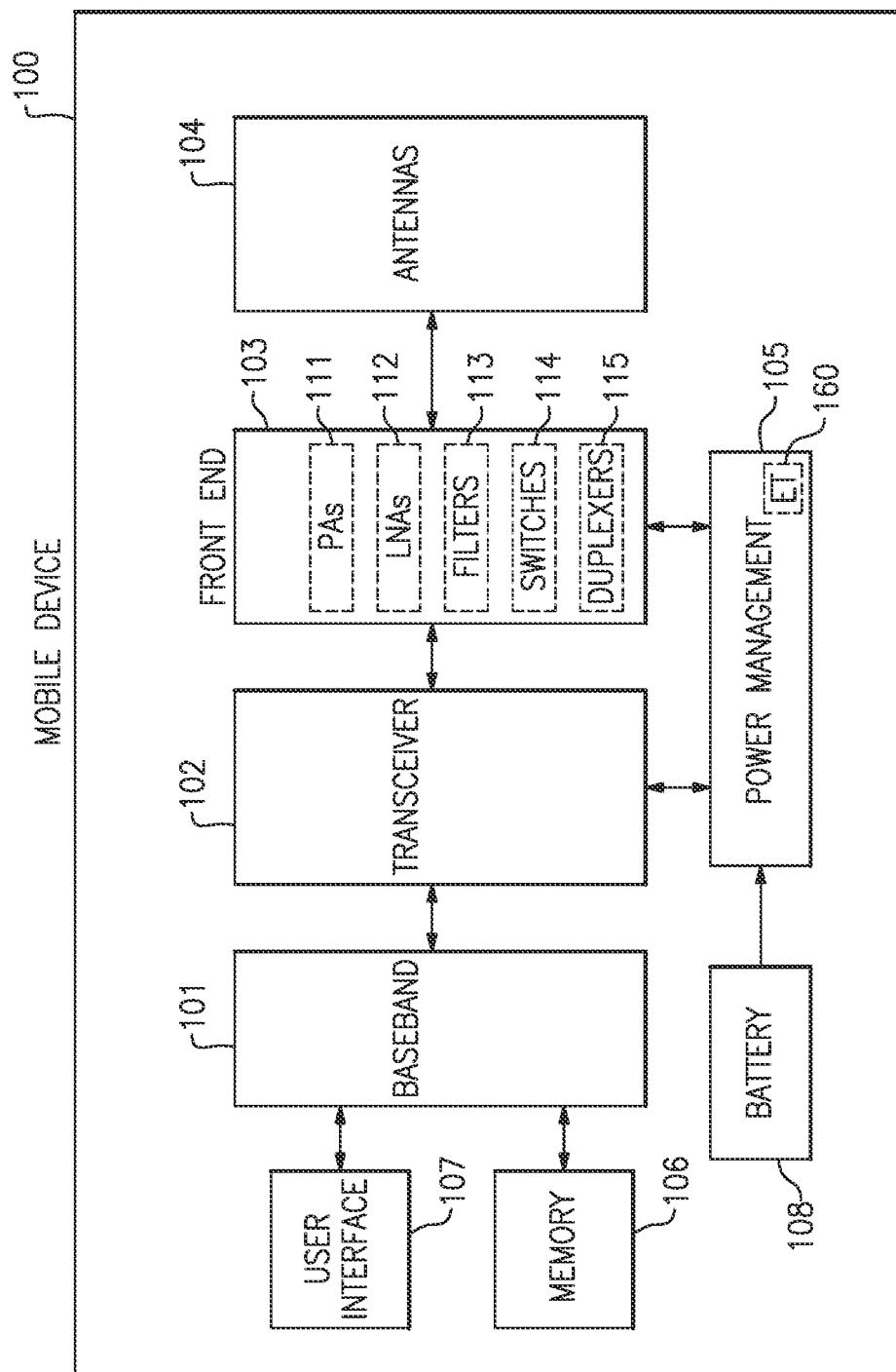
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 101, a transceiver 102, a front end system 103, antennas 104, a power management system 105, a memory 106, a user interface 107, and a battery 108.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 102 generates RF signals for transmission and processes incoming RF signals received from the antennas 104. It will be understood that various functionalities associated with the transmission and receiving of RF signals can be achieved by one or more components that are collectively represented in FIG. 1 as the transceiver 102. In one example, separate components (for instance, separate circuits or dies) can be provided for handling certain types of RF signals.

The front end system 103 aids is conditioning signals transmitted to and/or received from the antennas 104. In the illustrated embodiment, the front end system 103 includes power amplifiers (PAs) 111, low noise amplifiers (LNAs) 112, filters 113, switches 114, and duplexers 115. However, other implementations are possible.

For example, the front end system 103 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 104 can include antennas used for a wide variety of types of communications. For example, the antennas 104 can include antennas associated transmitting and/or receiving signals associated with a wide variety of frequencies and communications standards.

In certain implementations, the antennas 104 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 103 can include phase shifters having variable phase controlled by the transceiver 102. Additionally, the phase shifters are controlled to provide beam formation and directivity for transmission and/or reception of signals using the antennas 104. For example, in the context of signal transmission, the phases of the transmit signals provided to the antennas 104 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 104 from a particular direction. In certain implementations, the antennas 104 include one or more arrays of antenna elements to enhance beamforming.

The baseband system 101 is coupled to the user interface 107 to facilitate processing of various user input and output (I/O), such as voice and data. The baseband system 101 provides the transceiver 102 with digital representations of transmit signals, which the transceiver 102 processes to generate RF signals for transmission. The baseband system 101 also processes digital representations of received signals provided by the transceiver 102. As shown in FIG. 1, the baseband system 101 is coupled to the memory 106 of facilitate operation of the mobile device 100.

The memory 106 can be used for a wide variety of purposes, such as storing data and/or instructions to facilitate the operation of the mobile device 100 and/or to provide storage of user information.

The power management system 105 provides a number of power management functions of the mobile device 100. The power management system 105 of FIG. 1 includes an envelope tracker 160. As shown in FIG. 1, the power management system 105 receives a battery voltage form the battery 108. The battery 108 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
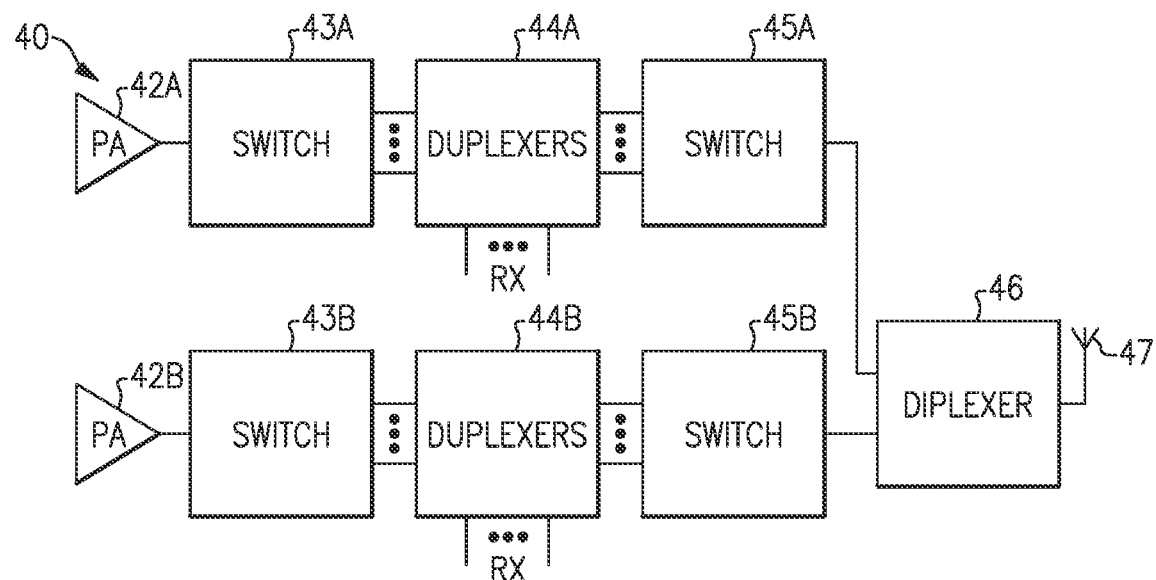
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexers 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
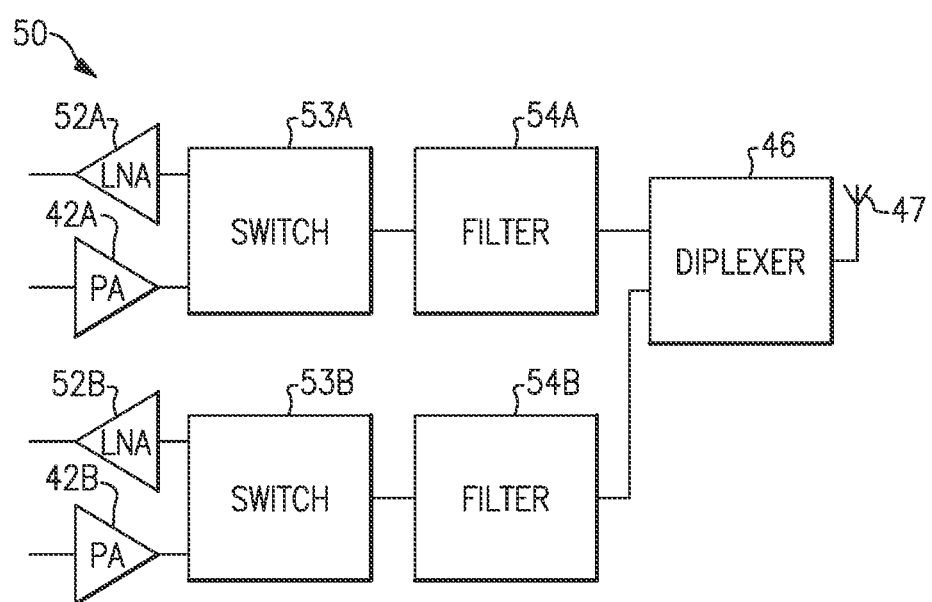
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
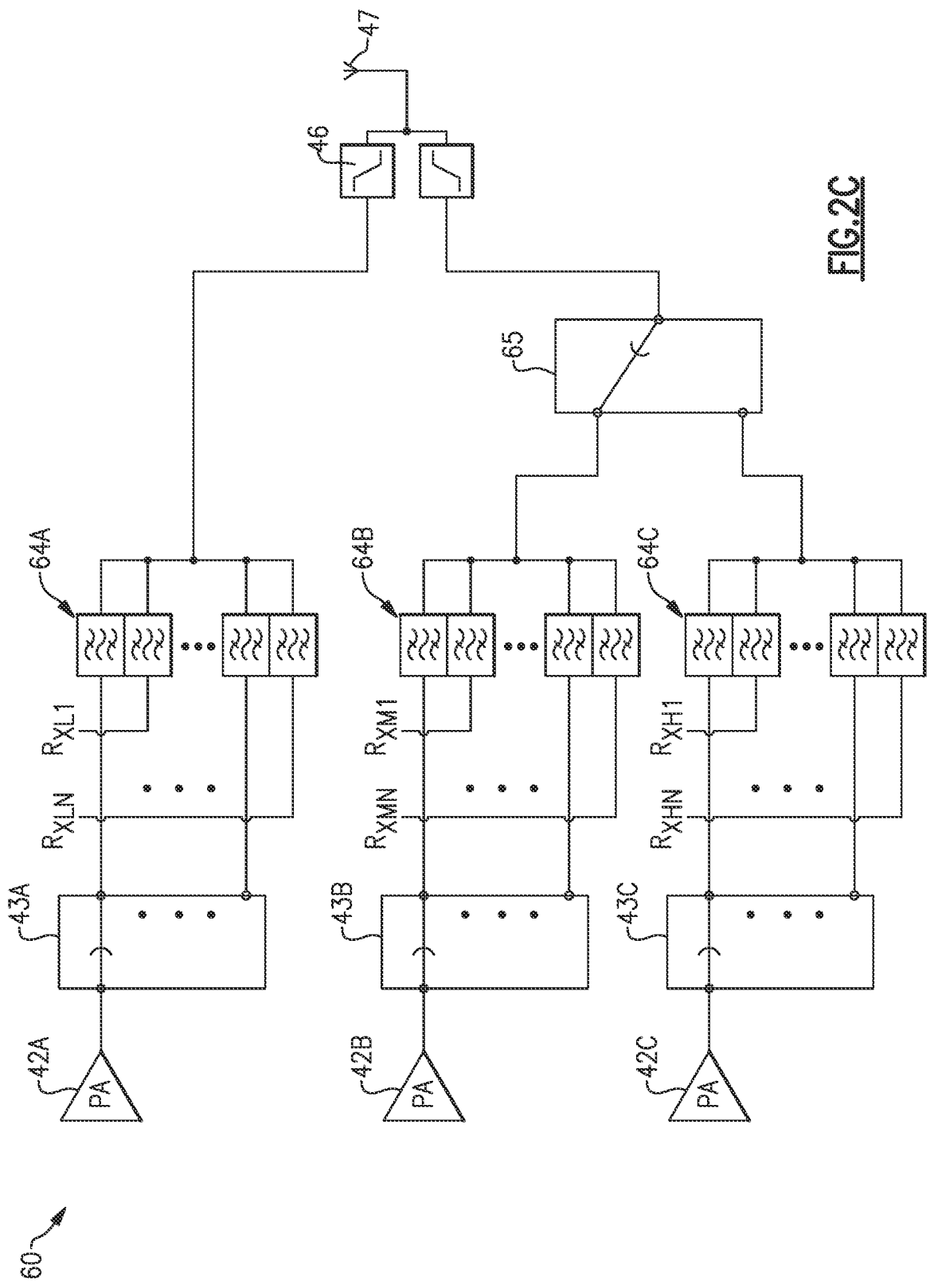
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain applications, a low band path can process radio frequency signals having a frequency of less than 1 GHz, a medium band path can process radio frequency signals having a frequency between 1 GHz and 2.2 GHz, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
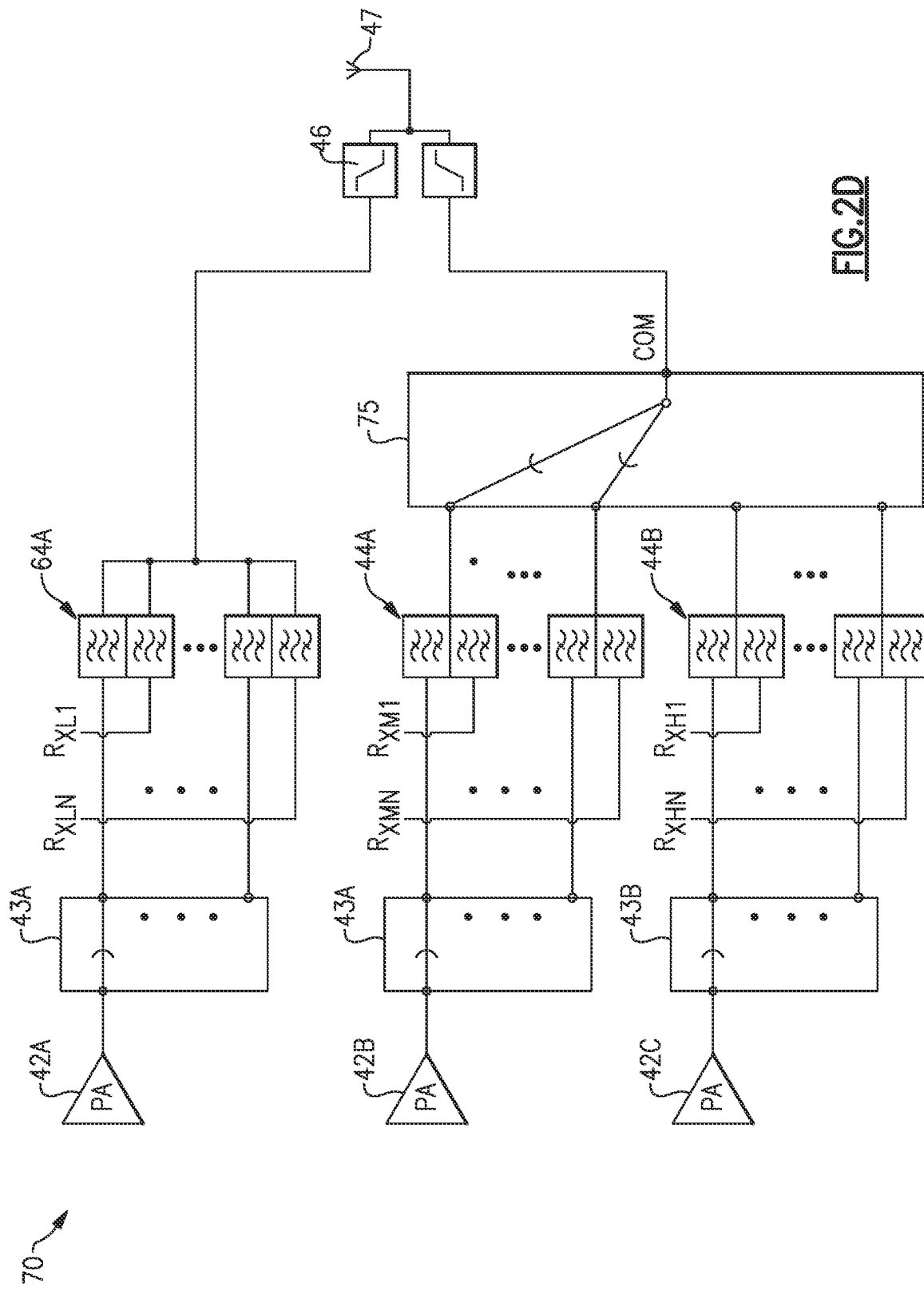
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A coupled to separate throws of the switch 75. Similarly, the illustrated duplexers 44B include a plurality of duplexers coupled to separate throws of the switch 75. Alternatively, instead of duplexers being coupled to each throw the switch 75 as illustrated in FIG. 2D, one or more individual filters of a multiplexer can be coupled to a dedicated throw of a switch coupled between the multiplexer and a common node. For instance, in some applications, such a switch could have twice as many throws as the illustrated switch 75.

Figure 3A:
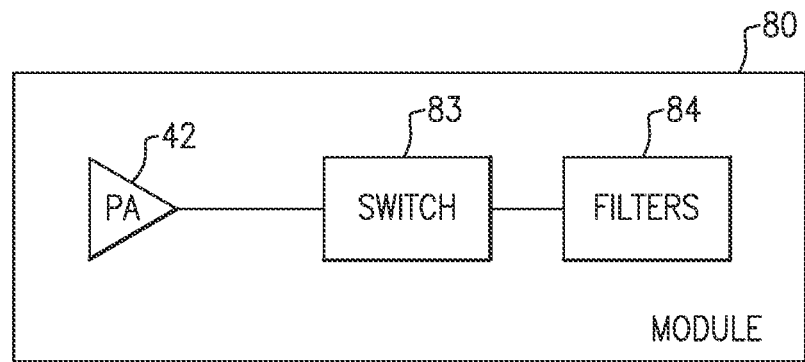
FIG. 3A is a schematic block diagram of a module that includes a filter.
Figure 3B:
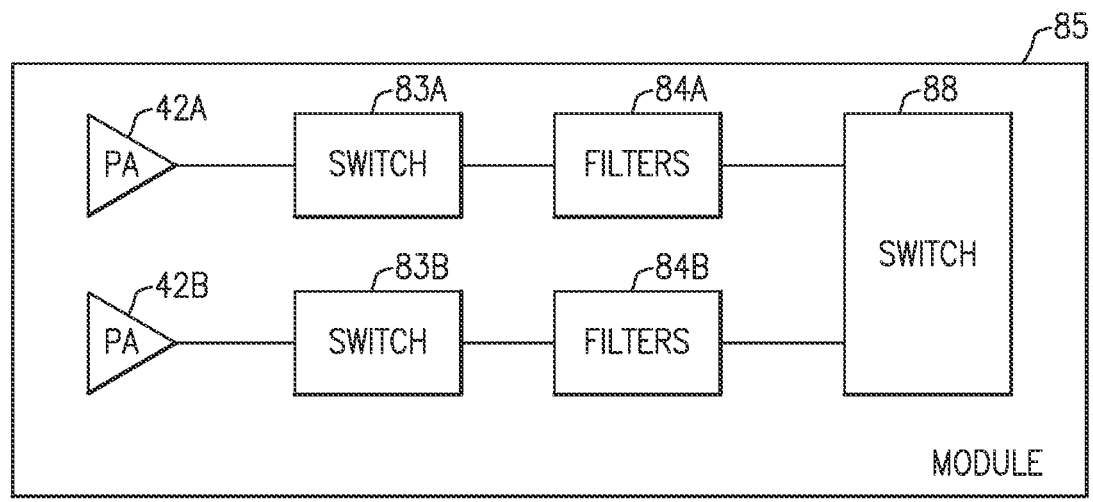
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 18A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

As discussed above, communications devices, such as mobile phones and the like, use filters and sub-systems incorporating filters (such as duplexers, diplexers, and the like) to separate signals in different frequency bands, such as transmission and reception signals, for example.

Temperature compensated surface acoustic wave (TC-SAW) filter is widely used for high performance RF module. Reliability of a TCSAW has a quite important role for ensuring final module product reliability. For example, inter-digital transducer (IDT) electrode has been regarded as a key of filter reliability. Meanwhile, the IDT electrode according to prior art may consist of two materials to achieve high conductivity and mass loading at the same time.

Figure 4:
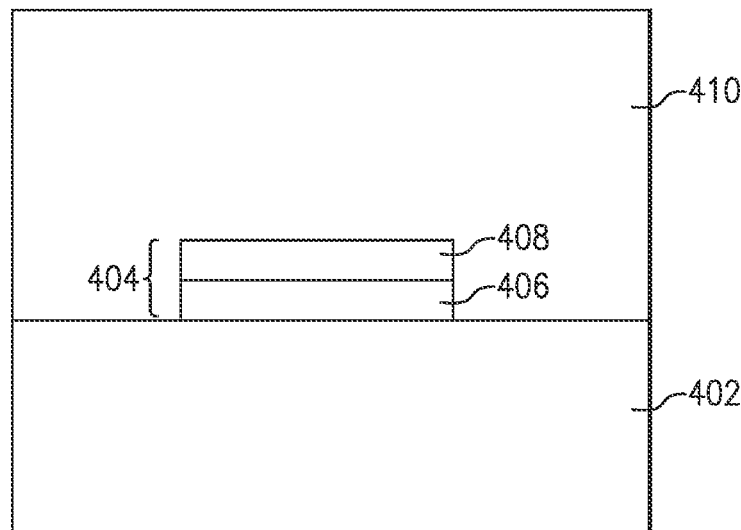
FIG. 4 is a schematic cross-sectional side view of an acoustic wave device with an interdigital transducer (IDT) electrode including two different materials.

FIG. 4 is a schematic cross-sectional side view of an acoustic wave device 400 with an interdigital transducer (IDT) electrode 404 that includes two different materials. The acoustic wave device 400 includes a substrate 402, the IDT electrode 404, and a dielectric film 410. The IDT electrode 404 includes a lower layer 406 and an upper layer 408. In this example, the substrate 402 can be a piezoelectric layer, such as a lithium niobate ($LiNbO_3$) layer. The lower layer 406 is formed of at least one of molybdenum (Mo), tungsten (W), and platinum (Pt). The upper layer 408 is formed of at least one of aluminium (Al), copper (Cu), silver (Ag) and gold (Au). The dielectric film 510 is formed of silicon dioxide ($SiO_2$). The dielectric film 510 can be a temperature compensation layer.

When two different metals are in contact with one another and have different diffusivities, atoms from the faster diffusing metal readily diffuse across the interface into the slower diffusing metal leaving voids. These voids coalesce into what is known as Kirkendall porosity. These pores can serve as nucleation sites for cracks or cause significant degradation to the mechanical or the electrical properties near the interface. As diffusion is a temperature activated phenomenon, this process can be exacerbated by higher temperatures. Also, when a multilayer IDT electrode includes a layer (e.g., the lower layer 406) that has a relatively low thermal conductivity (e.g., a temperature coefficient of expansion (TCE) of 9 ppm or lower) and a layer (e.g., the upper layer 408) that has a relatively high thermal conductivity (e.g., a temperature coefficient of expansion (TCE) of 15 ppm or greater), the TCE difference can apply excessive stress to the dielectric film 510 at an interface between the layers during operation of the acoustic wave device. The excessive stress can damage the acoustic wave device. Therefore, it is desired to develop an acoustic wave device with improved reliability while taking advantages of using two different metals for IDT electrode, by reducing stress occurred on the IDT electrode and even preventing the electromigration induced by the thermal stress. Hereinafter, acoustic wave devices with improved reliability according is disclosed.

Figure 5:
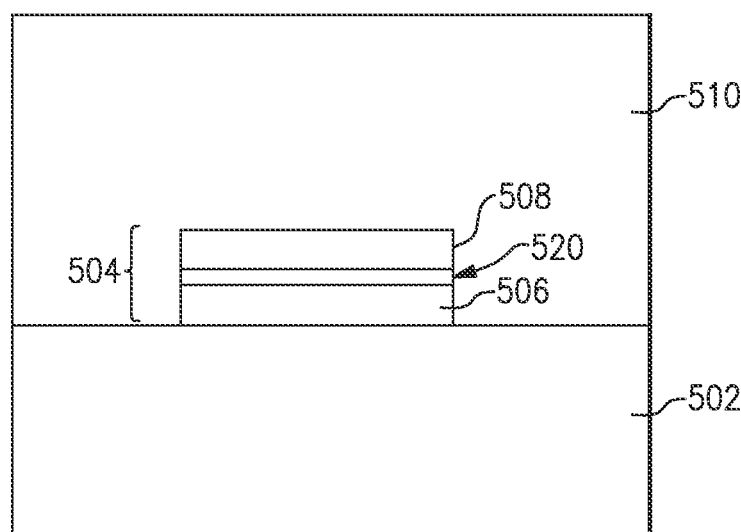
FIG. 5 is a schematic cross-sectional side view of an acoustic wave device according to an embodiment of the present disclosure.

FIG. 5 is a schematic cross-sectional side view of an acoustic wave device 500 according to an embodiment of the present disclosure. The acoustic wave device 500 according to an embodiment can be a SAW filter, or boundary wave filter with a shear horizontal (SH) mode. The acoustic wave device 500 illustrated in FIG. 5 further includes a buffer layer 520 added between the lower layer and upper layer of the IDT electrode.

The acoustic wave device 500 can include a substrate 502, at least one electrode 504, and a dielectric film 510. The substrate 502 can be a piezoelectric layer such as a lithium niobate ($LiNbO_3$) layer. In some embodiments, the substrate 502 can a LN layer having a cut angle in a range of 116° to 134° that enables the acoustic wave device 500 to generate, for example, a Rayleigh mode surface acoustic wave. In some embodiments, the substrate 502 provides a medium in which an acoustic wave can propagate. The substrate 502 can be sufficiently thick to avoid significant frequency variation. For example, a thickness of the substrate 502 can be in a range of 100 µm and 350 µm. The electrode 504 is an interdigital transducer (IDT) electrode. The electrode 504 can be disposed on the substrate to excite a boundary wave at the substrate 502. The dielectric film 510 is formed to cover at least a part of the substrate 502 and the electrode 504. The dielectric film 510 can be a silicon dioxide ($SiO_2$). The dielectric film 510 can include a material that can bring a temperature coefficient of frequency closer to zero. A thickness of the dielectric film 510 may be between 500 nm and 4000 nm.

The electrode 504 can include a lower layer 506, an upper layer 508, and a buffer layer 520 between the lower layer 506 and the upper layer 508. Each layer of the electrode 504 can be configured in plate-shape having a thickness. Each layer of the electrode 504 has respective modulus of elasticity. The modulus elasticity is used for measuring a tensile or compressive stiffness when a force is applied. The modulus elasticity quantifies the relationship between tensile/compressive stress (force per unit area) and axial strain (proportional deformation) in the linear elastic region of a material. The modulus elasticity can be referred to as Young's modulus, or Young modulus (GPs: Giga-pascals). In addition, each layer of the electrode 504 has a respective temperature coefficient of expansion (TCE) value corresponding to the material used for each layer.

The lower layer 506 can be disposed on the substrate 502. The lower layer 506 can be in contact with the substrate 502. The lower layer 506 can include a material that provides mass loading. That is, the lower layer 506 can have a mass density that is greater than the upper layer 508 and/or high resistance. The lower layer 506 contributes to a linearity of the response of the acoustic wave device 500. According to some embodiments, the lower layer 506 can include one of molybdenum (Mo), tungsten (W), and platinum (Pt). The lower layer 506 can have a thickness less than 500 nm. In some embodiments, the thickness of the lower layer 506 can be in a range from 0.03 L to 0.10 L (e.g., about 0.08 L). For example, when the wavelength L is about 4 µm, the thickness of the lower layer 506 can be about 320 nm.

The upper layer 508 can be disposed at an upper portion of the electrode 504. The upper layer 508 can include a material that provides high conductivity. The upper layer 508 can be formed of at least one of aluminium (Al), copper (Cu), silver (Ag) and gold (Au). The upper layer 508 can have a thickness less than 500 nm. In some embodiments, the thickness t3 of the upper layer 508 can be in a range from 0.02 L to 0.08 L (e.g., about 0.04 L). For example, when the wavelength L is about 4 µm, the thickness of the upper layer 508 can be about 160 nm. In some embodiments, the electrode 504 may include alloys, such as AlMgCu, AlCu, etc.

The buffer layer 520 can be disposed between the lower layer 506 and the upper layer 508 to enhance the reliability of the acoustic wave device 500. More specifically, the buffer layer 520 disposed between the lower layer 506 and the upper layer 508 can function as a transition layer to relax stress due to different moduli of elasticity in the lower layer 506 and the upper layer 508. The buffer layer 520 may be referred to as a release layer. Since the lower layer 506 and the upper layer 508 have different characteristics in response to a stress that is applied to the electrode 504, the boundaries of the lower layer 506 and the upper layer 508 are vulnerable to the external stress. According to some embodiments, the buffer layer 520 has a first modulus of elasticity larger than a second modulus of elasticity of the upper layer 508.

According to some embodiments, the buffer layer 520 has the first modulus of elasticity less than a third modulus of elasticity of the lower layer 506. In some embodiments, the buffer layer 520 can include titanium (Ti), chromium (Cr), or a like material. Any suitable combinations of the materials of the lower layer 506, the upper layer 508, and the buffer layer 520 disclosed herein can be beneficial.

According to some embodiments, the lower layer 506 can include Mo whose third modulus of elasticity is 327 [GPs], the upper layer 508 can include Al whose second modulus of elasticity is 70 [GPs], and the buffer layer 520 can include Ti whose first modulus of elasticity is 108 [GPs].

According to an embodiment, the lower layer 506 can include W whose third modulus of elasticity is 345 [GPs], the upper layer 508 can include Al whose second modulus of elasticity is 70 [GPs], and the buffer layer 520 can include Ti whose first modulus of elasticity is 108 [GPs].

According to an embodiment, the lower layer 506 can include Pt whose third modulus of elasticity is 168 [GPs], the upper layer 508 can include Al whose second modulus of elasticity is 70 [GPs], and the buffer layer 520 can include whose first modulus of elasticity is 108 [GPs].

In addition, the buffer layer 520 is configured to relax thermal expansion stress. The thermal expansion stress is caused by differential of temperature coefficient of expansion (TCE) between the lower layer 506 and the upper layer 508. The buffer layer 520 has a first temperature coefficient of expansion (TCE) value less than a second TCE value of the upper layer 508. Additionally, the buffer layer 520 may have a first TCE larger than a third TCE value of the lower layer 506. For example, the first TCE value of the buffer layer 520 is less than the second TCE value of the upper layer 508, and larger than the third TCE value of the lower layer 506.

According to some embodiments, the lower layer 506 can include Mo whose TCE value is 4.8 ppm (part per million), the upper layer 508 can include Al whose TCE value is 23 ppm, and the buffer layer 520 can include Ti whose TCE value is 8.6 ppm.

According to some embodiments, the lower layer 506 is formed of W whose TCE value is 4.5 ppm, the upper layer 508 is formed of Al whose TCE value is 23 ppm, and the buffer layer 520 is formed of Ti whose TCE value is 8.6 ppm.

In some embodiments, the substrate 502 can include LN whose TCE value is 15.7 ppm, and the dielectric film 510 can include $SiO_2$ whose TCE value is 4.5 ppm.

The technical effect of reducing stress depends at least in part on a thickness of the buffer layer 520. When the thickness of the buffer layer 520 is too thin, the buffer layer 520 may not sufficiently work as the transition layer between the lower layer 506 and the upper layer 508. According to an embodiment, the thickness of the buffer layer 520 can be 20 nm or greater. On the other hand, when the buffer layer 520 is too thick, the advantage of combining the lower layer 506 and the upper layer 508 is reduced due to the distance between the lower layer 506 and the upper layer 508. Also, from a design perspective, excessive thickness of the buffer layer 520 may not be preferred as it can increase the overall thickness of the acoustic wave device 500. According to some embodiments, the thickness of the buffer layer 520 can be less than 1000 nm. For example, the buffer layer 520 can have a thickness in a range of 20 nm to 1000 nm, 20 nm to 200 nm, 20 nm to 100 nm, 30 nm to 200 nm, or 50 nm to 100 nm. In some embodiments, the thickness of the buffer layer 520 can be in a range of 5% to 30%, 10% to 30%, or 5% to 20% of the total thickness of the electrode 504.

According to some embodiments, at least a portion of the buffer layer 520 and at least a portion of the upper layer 508 can form an intermetallic layer at an interface between the buffer layer 520 and the upper layer 508. In some embodiments, the intermetallic layer may include titanium aluminide ($TiAl_3$), formed at elevated temperatures by the solid state reaction between metallic aluminum and metallic titanium, when, for example, the upper layer 508 is formed of Al and the buffer layer 520 is formed of Ti. The intermetallic layer provides high conductivity, and therefore it enables to increase resistivity of the electrode 504 as compared to other materials with lower conductivities. In addition, the intermetallic layer can prevent or mitigate migration of atoms from the upper layer 508 into the buffer layer 520. More specifically, the intermetallic layer generates an electrically conductive diffusion barrier that prevents or mitigates the migration between two metal layers. Therefore, the buffer layer 520 can be sufficiently hard so as to prevent or mitigate stress-induced electromigration. Thus the buffer layer 520 can enable the acoustic wave device 500 to me more reliable as the stress-induced electromigration can cause cracks when certain degrees of heat is applied.

In addition, by adding buffer layer 520 between the lower layer 506 and the upper layer 508, improved crystallinity of the upper layer 508 would result from the suppression of interfacial diffusion. The prevention or mitigation of a more disordered structure would decrease the resistivity of layer 508, thus improving performance. Thus, resistivity and electro migration durability of the acoustic wave device 500 can be improved.

According to some embodiments, the electrode 504 further includes an adhesion layer (not shown) below the upper layer 508. For example, the adhesion layer can include tantalum (Ta). A thin adhesion layer may be configured to provide high surface energy so as to enable more atoms to move to order lattice. By adding the adhesion layer, the crystallinity can be improved, and therefore the adhesion of the upper layer 508 can be further improved.

FIG. 6A shows a measured stress distribution in the acoustic wave device 400 that includes a molybdenum (Mo) IDT layer. The result of measured thermal stress in the acoustic wave device 400 is represented in different types of shades. In the measurement, the acoustic wave device 400 includes a substrate 402 formed of LN, an IDT electrode 404, and a dielectric film 410 formed of $SiO_2$. The IDT electrode 404 includes a lower layer 406 formed of Mo, and an upper layer 408 formed of Al.

The stress in the acoustic wave device 400 is mainly generated at or near the surface of the IDT electrode 404, in particular at or near the edges of the lower layer 406. FIG. 6A indicates a relatively high stress at or near the edges of the lower layer 406 (indicated as an area (a)), which leads to degraded reliability. The area (a) of FIG. 6A indicates that the stress can be generated more at the edge of the lower layer 406 closer to the upper layer 408.

FIG. 6B shows a measured stress distribution in the acoustic wave device 500 according to an embodiment that includes a molybdenum (Mo) IDT layer. In the measurement of FIG. 6B, a lithium niobate (LN) layer is used as the substrate 502, a molybdenum (Mo) layer is used as the lower layer 506, an aluminum (Al) layer is used as the upper layer 508, a titanium (Ti) layer is used as the buffer layer 520, and a silicon dioxide ($SiO_2$) layer is used as the dielectric film 510.

FIG. 6B indicates that the stress in the acoustic wave device 500 is reduced as compared to the acoustic wave device 400 of FIG. 6A. An area (b) of FIG. 6B, indicates that the edge of the lower layer 506 has less stress as compared to the edge of the lower layer 406 shown in FIG. 6A. In FIG. 6B, since the stress is reduced relative to the result of FIG. 6A, the reliability of the acoustic wave device 500 is enhanced relative to the acoustic wave device 400. The measurement results of FIGS. 6A and 6B indicate that a buffer layer between layers of a multilayer IDT structure can reduce stress in an acoustic wave device.

Figures 2, 7B:
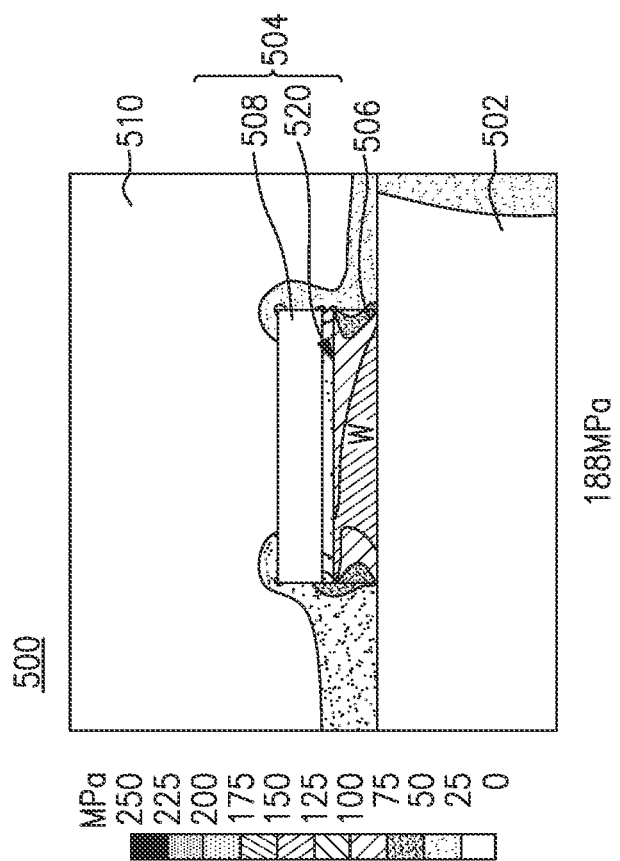
Figures 1, 7B:
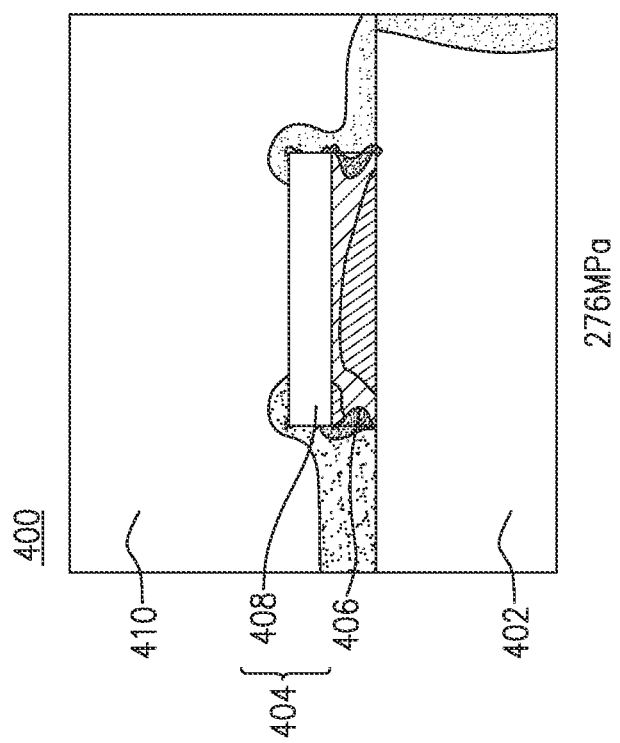

FIG. 7A-1 shows a simulated stress distribution in the acoustic wave device 400 that includes a molybdenum (Mo) IDT layer. FIG. 7A-2 shows a simulated stress distribution in the acoustic wave device 500 according to an embodiment that includes a molybdenum (Mo) IDT layer. Unless otherwise noted, components of FIGS. 7A-1 and 7A-2 are the same or general similar to the like components of FIGS. 4-6B. As shown in FIGS. 7A-1 and 7A-2, a lower stress is observed in the acoustic wave device 500 as compared to the acoustic wave device 400.

The simulation result of FIG. 7A-1 indicates that a maximum stress in the dielectric film 410 of the acoustic wave device 400 is about 260 MPa. Meanwhile, the simulation result of FIG. 7A-1 indicates that a maximum stress in the dielectric film 510 of the acoustic wave device 500 is about 168 MPa. Therefore, the simulation results of FIGS. 7A-1 and 7A-2 indicate that the maximum stress can be reduced by adding the buffer layer 520 (e.g., a Ti layer).

FIG. 7B-1 shows a simulated stress distribution in the acoustic wave device 400 that includes a tungsten (W) IDT layer. FIG. 7B-2 shows a simulated stress distribution in the acoustic wave device 500 according to an embodiment that includes a tungsten (W) IDT layer. Unless otherwise noted, components of FIGS. 7B-1 and 7B-2 are the same or general similar to the like components of FIGS. 4 to 6A-2. As indicated in FIGS. 7B-1 and 7B-2, the acoustic wave device 500 which includes the buffer layer 520 formed of Ti has improved reliability as compared to the acoustic wave device 400 without the buffer layer 520.

The simulation result of FIG. 7B-1 indicates that a maximum stress in the dielectric film 410 of the acoustic wave device 400 is about 276 MPa. Meanwhile, the simulation result of FIG. 7A-1 indicates that a maximum stress in the dielectric film 510 of the acoustic wave device 500 is about 188 MPa. Therefore, the simulation results of FIGS. 7B-1 and 7B-2 indicate that the maximum stress can be reduced by adding the buffer layer 520 (e.g., a Ti layer).

Figures 2, 7C:
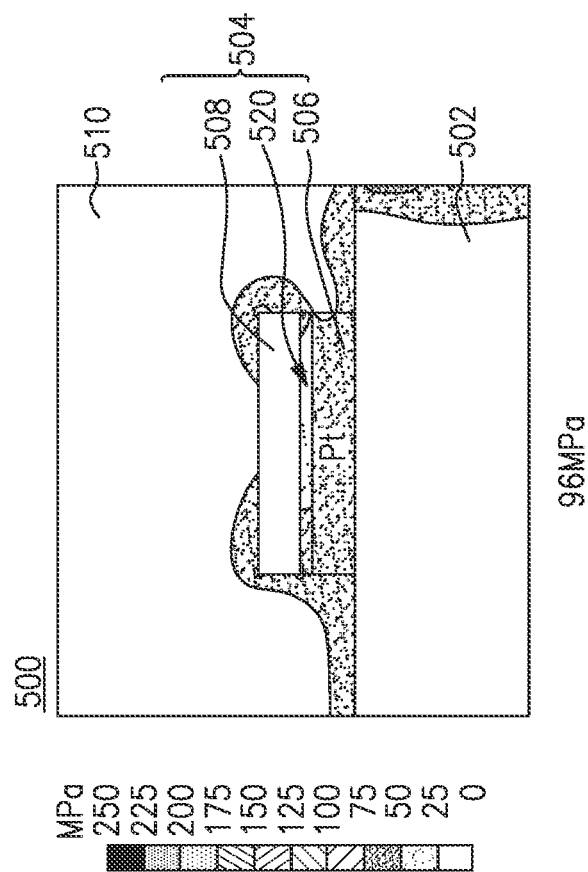
Figures 1, 7C:
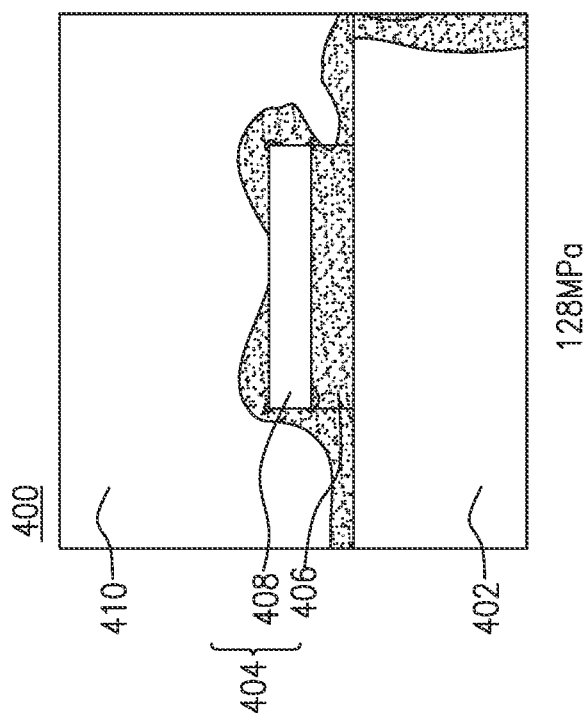

FIG. 7C-1 shows a simulated stress distribution in the acoustic wave device 400 that includes a platinum (Pt) IDT layer. FIG. 7C-2 shows a simulated stress distribution in the acoustic wave device 500 according to an embodiment that includes a platinum (Pt) IDT layer. Unless otherwise noted, components of FIGS. 7C-1 and 7C-2 are the same or general similar to the like components of FIGS. 4 to 6B-2. As indicated in in FIGS. 7C-1 and 7C-2, the acoustic wave device 500 which includes the buffer layer 520 formed of Ti has improved reliability with compared to the acoustic wave device 400 without the buffer layer 520.

The simulation result of FIG. 7C-1 indicates that a maximum stress in the dielectric film 410 of the acoustic wave device 400 is about 128 MPa. Meanwhile, the simulation result of FIG. 7A-1 indicates that a maximum stress in the dielectric film 510 of the acoustic wave device 500 is about 96 MPa. Therefore, the simulation results of FIGS. 7C-1 and 7C-2 indicate that the maximum stress can be reduced by adding the buffer layer 520 (e.g., a Ti layer).

Figures 2, 8A:
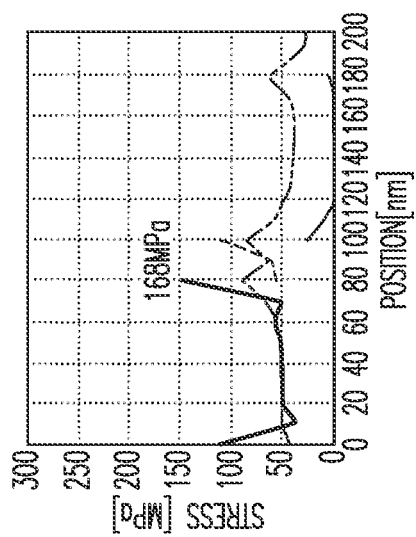
Figures 1, 8A:
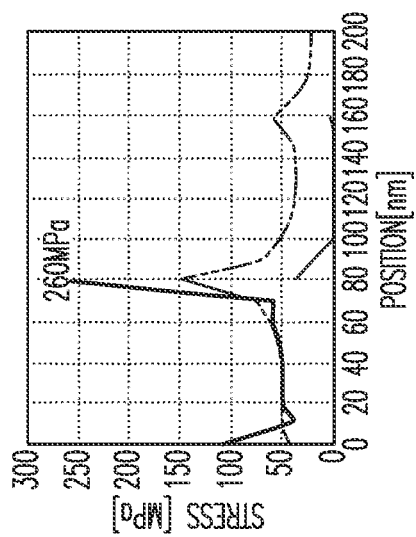

FIG. 8A-1 is a graph showing simulated stress distribution along a side edge of the IDT electrode 404 of FIG. 7A-1 that includes a molybdenum (Mo) layer. FIG. 8A-2 is a graph showing simulated stress distribution along a side edge of the electrode 504 of FIG. 7A-2 that includes a platinum (Mo) layer. The positions in the graphs indicate distances from the surfaces of the substrates 402, 502 to which the IDT electrode 404 and the electrode 504 are positioned.

The simulation result of FIG. 8A-1 indicates that a maximum stress in the lower layer of the acoustic wave device 400 is about 260 MPa. The position in which the maximum stress is observed is at about 80 nm which corresponds to the boundary between the lower layer 406 and the upper layer 408.

Meanwhile, the simulation result of FIG. 8A-2 indicates that a maximum stress in the lower layer 506 (the Mo layer) of the acoustic wave device 500 is about 168 MPa at about 80 nm. In addition, the overall stress is generally reduced in the acoustic wave device 500 as compared to the acoustic wave device 400. Therefore, the reliability of the acoustic wave device 500 of FIG. 7A-2 is improved relative to the acoustic wave device 400 of FIG. 7A-1.

Figures 2, 8B:
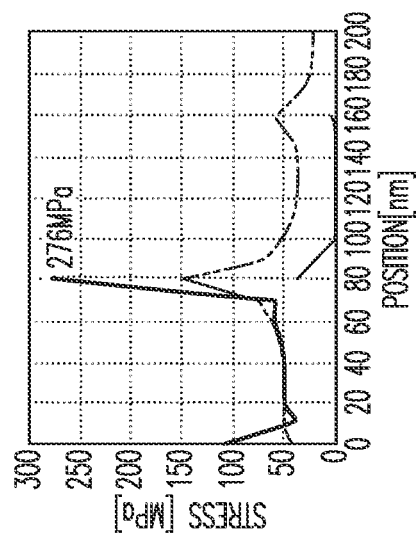
Figures 1, 8B:
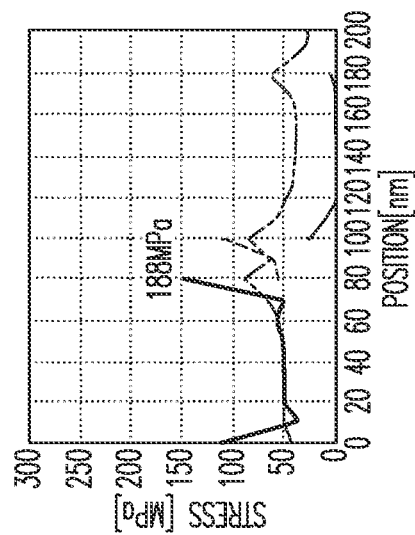

FIG. 8B-1 is a graph showing simulated stress distribution along a side edge of the IDT electrode 404 of FIG. 7B-1 that includes a tungsten (W) layer. FIG. 8B-2 is a graph showing simulated stress distribution along a side edge of the electrode 504 of FIG. 7B-2 that includes a platinum (W) layer. The positions in the graphs indicate distances from the surfaces of the substrates 402, 502 to which the IDT electrode 404 and the electrode 504 are positioned.

The simulation result of FIG. 8B-1 indicates that a maximum stress in the lower layer of the acoustic wave device 400 is about 276 MPa. The position in which the maximum stress is observed is at about 80 nm which corresponds to the boundary between the lower layer 406 and the upper layer 408.

Meanwhile, the simulation result of FIG. 8B-2 indicates that a maximum stress in the lower layer 506 (e.g., the W layer) of the acoustic wave device 500 is about 188 MPa at about 80 nm. In addition, the overall stress is generally reduces in the acoustic wave device 500 as compared to the acoustic wave device 400. Therefore, the reliability of the acoustic wave device 500 of FIG. 7B-2 is improved relative to the acoustic wave device 400 of FIG. 7B-1.

Figures 2, 8C:
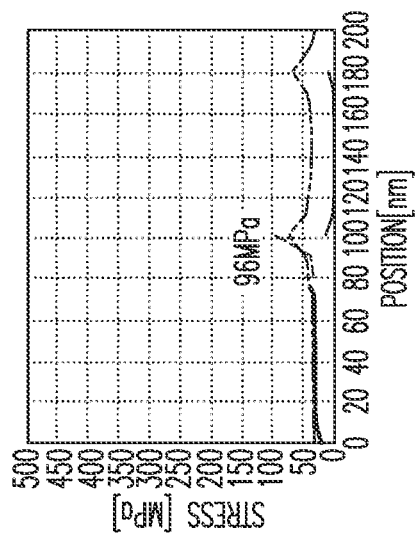
Figures 1, 8C:
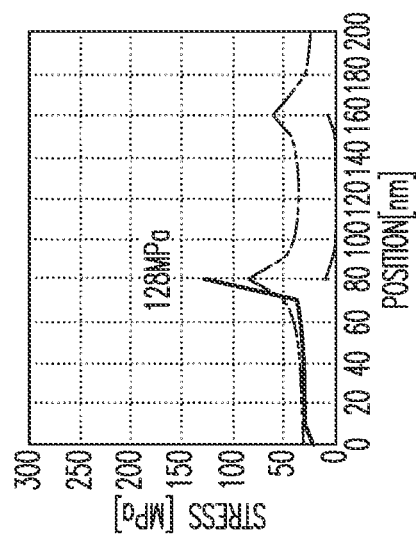

FIG. 8C-1 is a graph showing simulated stress distribution along a side edge of the IDT electrode 404 of FIG. 7C-1 that includes a platinum (Pt) layer. FIG. 8C-2 is a graph showing simulated stress distribution along a side edge of the electrode 504 of FIG. 7C-2 that includes a platinum (Pt) layer. The positions in the graphs indicate distances from the surfaces of the substrates 402, 502 to which the IDT electrode 404 and the electrode 504 are positioned.

The simulation result of FIG. 8C-1 indicates that a maximum stress in the lower layer of the acoustic wave device 400 is about 128 MPa. The position in which the maximum stress is observed is at about 80 nm which corresponds to the boundary between the lower layer 406 and the upper layer 408. Meanwhile, the simulation result of FIG. 8B-2 indicates that a maximum stress in the lower layer 506 (the Pt layer) of the acoustic wave device 500 is about 96 MPa at 80 nm. In addition, overall stress is generally reduces in the acoustic wave device 500 as compared to the acoustic wave device 400. Therefore, the reliability of the acoustic wave device 500 of FIG. 7C-2 is improved relative to the acoustic wave device 400 of FIG. 7C-1.

Figure 9A:
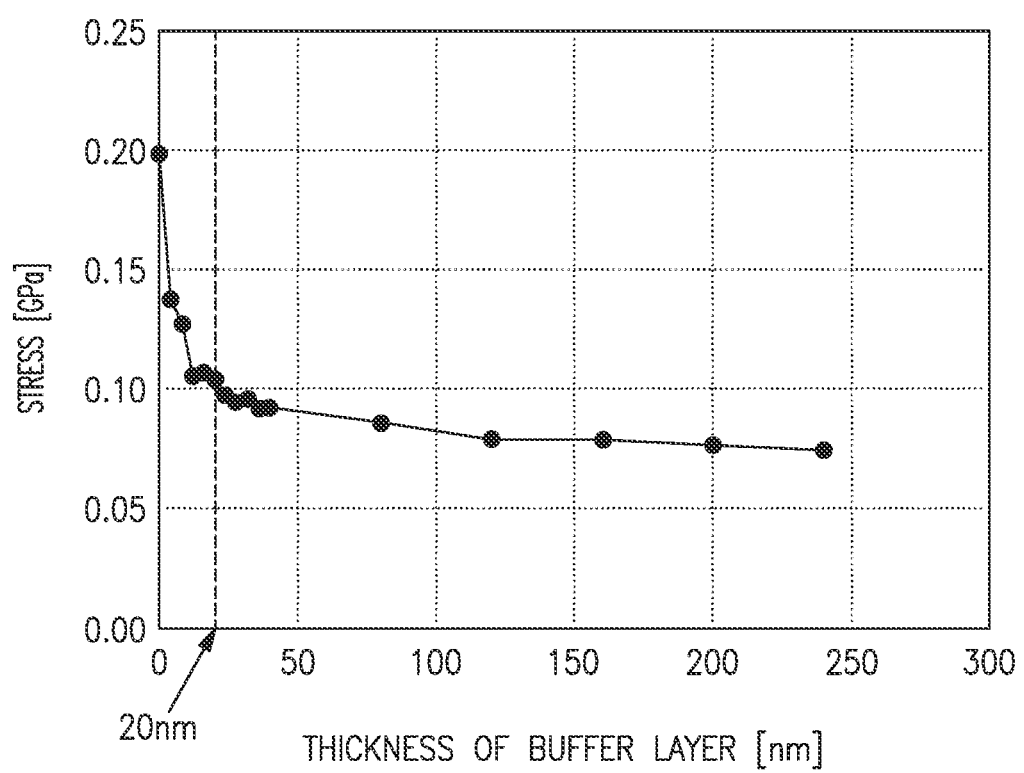
FIG. 9A is a graph showing the maximum stress in an acoustic wave device according to an embodiment simulated with different thicknesses of a buffer layer.

FIG. 9A is a graph showing the maximum stress along the electrode 504 in the acoustic wave device 500 simulated with different thicknesses of the buffer layer 520. FIG. 9A indicates that the maximum stress can be reduced as the thickness of the buffer layer is increases from '0'. When the thickness of the buffer layer 520 is too thin (e.g., less than about 5 nm, less than about 10 nm, or less than 20 nm), the buffer layer may not sufficiently work as the transition layer between the lower layer 506 and the upper layer 508. Therefore, it may be beneficial to form at least certain thickness of the buffer layer 520. According to some embodiments, the thickness of the buffer layer 520 can be 20 nm or greater.

On the other hand, at some point, the stress on the dielectric film 510 is maintained at certain level regardless of the thickness of the buffer layer. In other words, there may be little or no benefit, particularly in terms of design and spacial aspect, to increase the thickness of the buffer layer 520 over a certain level of the thickness. According to some embodiment, the thickness of the buffer layer 520 can be less than 1000 nm. For example, the buffer layer 520 can have a thickness in a range of 20 nm to 1000 nm, 20 nm to 200 nm, 20 nm to 100 nm, 30 nm to 200 nm, or 50 nm to 100 nm. In some embodiments, the thickness of the buffer layer 520 can be in a range of 5% to 30%, 10% to 30%, or 5% to 20% of the total thickness of the electrode 504.

Figure 9B:
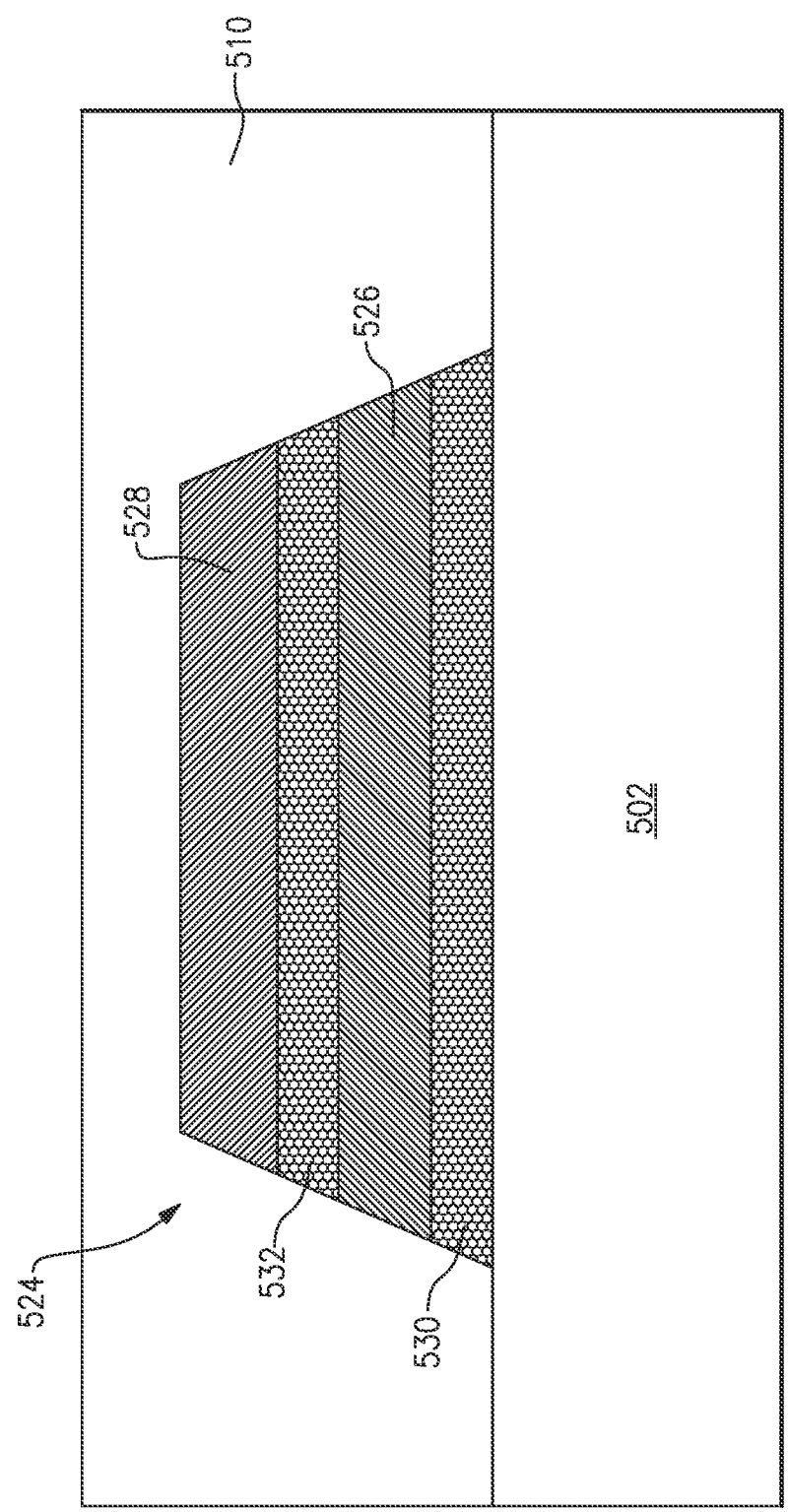
FIG. 9B is a schematic cross-sectional side view of an acoustic wave device according to an embodiment.

FIG. 9B is a schematic cross-sectional side view of an acoustic wave device 500' according to an embodiment. The acoustic wave device 500' can be a temperature compensated surface acoustic wave (TC-SAW) device. The acoustic wave device 500' can include a substrate 502 (e.g., a piezoelectric layer), an interdigital transducer (IDT) electrode 524, and a dielectric film 510 (e.g., a temperature compensation layer). The IDT electrode 524 can include a first layer 526, a second layer 528 over the first layer 526, a first buffer layer 530 between the first layer 526 and the substrate 502, and a second buffer layer 532 between the first layer 526 and the second layer 528.

The first and second layers 526, 528 can be structurally and functionally the same as or generally similar to the lower layer 506 and the upper layer 508, respectively. The first and second buffer layers 530, 532 can be structurally and functionally the same as or generally similar to the buffer layer 520 disclosed herein. In some embodiments, the first layer 530 can release stress between the substrate 502 and the first layer 526, and the second buffer layer 532 can release stress between the first and second layers 526, 528. In some embodiments, there may be more IDT layers In some embodiments, the IDT electrode 524 can have a slanted or sloped sidewall. For example, the sidewall of the IDT electrode 524 can be slanted or sloped such that a width of an upper side of the first layer 526 that faces the second layer 528 can be greater than a width of a lower side of the second layer 528 that faces the first layer 526.

The principles and advantages disclosed herein can be implemented in any temperature compensated surface acoustic wave (TC-SAW) devices. The TC-SAW device can be implemented in a variety of electronic systems.

Figure 10A:
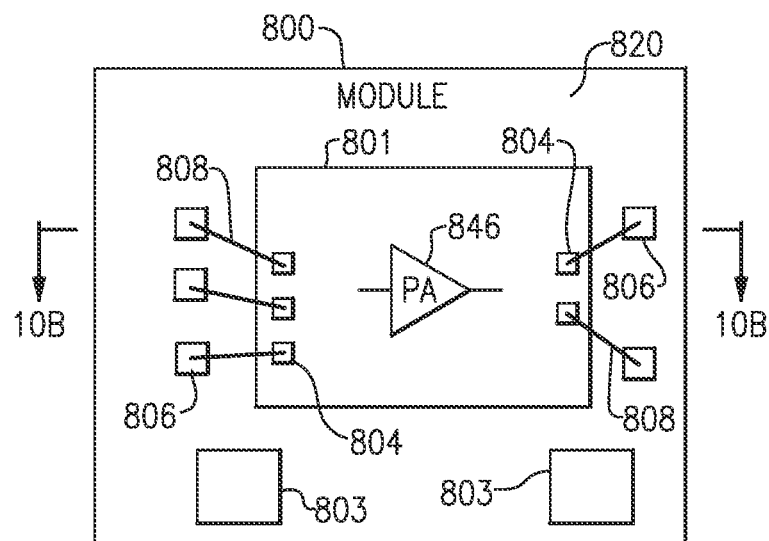
FIG. 10A is a schematic diagram of one embodiment of a packaged module.
Figure 10B:
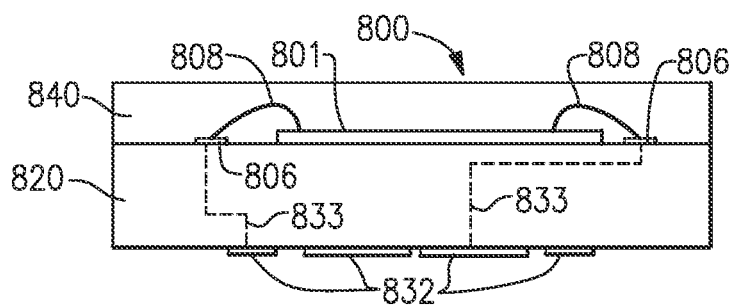
FIG. 10B is a schematic cross-sectional side view of the packaged module of FIG. 10A.

FIG. 10A is a schematic diagram of one embodiment of a packaged module 800. FIG. 10B is a schematic diagram of a cross-section of the packaged module 800 of FIG. 10A taken along the lines 10B-10B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a filter module, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 10B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 16B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 11:
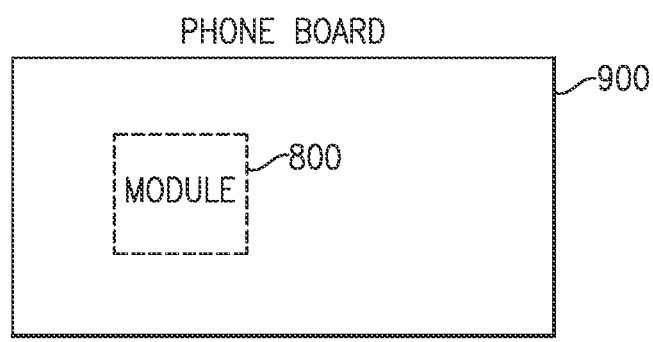
FIG. 11 is a schematic diagram of one embodiment of a phone board.

FIG. 11 is a schematic diagram of one embodiment of a phone board 900. The phone board 900 includes the packaged module 800 shown in FIGS. 10A-10B attached thereto. Although not illustrated in FIG. 10 for clarity, the phone board 900 can include additional components and structures. Some of the embodiments described above have provided examples in connection with wireless devices or mobile phones. However, the principles and advantages of the embodiments can be used for any other systems or apparatus that have needs for power amplifiers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of this disclosure is not intended to be exhaustive or to limit the invention to the precise form disclosed above. While specific embodiments of, and examples for, this disclosure are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of this disclosure provided herein can be applied to other systems, not necessarily the system described above. The elements and acts of the various embodiments described above can be combined to provide further embodiments.

While certain embodiments of this disclosure have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An acoustic wave device comprising:
a substrate;
an interdigital transducer electrode disposed on the substrate, the interdigital transducer electrode including a lower layer, an upper layer, and a buffer layer disposed between the lower layer and the upper layer, a modulus of elasticity of the buffer layer being less than a modulus of elasticity of the upper layer, the buffer layer configured to release stress between the lower layer and the upper layer caused due to a difference between a first coefficient of thermal expansion of the lower layer and a second coefficient of thermal expansion of the upper layer; and
a temperature compensation layer over the interdigital transducer electrode.

2. The acoustic wave device of claim 1 wherein the modulus of elasticity of the buffer layer is less than a modulus of elasticity of the lower layer.

3. The acoustic wave device of claim 1 further comprises an intermetallic layer between the buffer layer and the upper layer.

4. The acoustic wave device of claim 1 wherein the buffer layer has a third coefficient of thermal expansion that is less than the second coefficient of thermal expansion of the upper layer.

5. The acoustic wave device of claim 1 wherein the buffer layer has a third coefficient of thermal expansion that is larger than the first coefficient of thermal expansion of the lower layer.

6. The acoustic wave device of claim 1 wherein the buffer layer includes titanium (Ti).

7. The acoustic wave device of claim 1 wherein the upper layer includes at least one of aluminium (Al), copper (Cu), silver (Ag), and gold (Au).

8. The acoustic wave device of claim 1 wherein the lower layer includes at least one of molybdenum (Mo), tungsten (W), and platinum (Pt).

9. The acoustic wave device of claim 1 wherein a thickness of the buffer layer is more than 20 nm and less than 1000 nm.

10. The acoustic wave device of claim 1 wherein a thickness of the upper layer is less than 500 nm, and a thickness of the lower layer is less than 500 nm.

11. The acoustic wave device of claim 1 wherein the interdigital transducer electrode further includes an adhesion layer between the upper layer and the buffer layer.

12. A radio frequency module comprising:
a packaging board configured to receive a plurality of components; and
an acoustic wave device mounted on the packaging board, the acoustic wave device including a substrate, an interdigital transducer electrode disposed on the substrate, and a temperature compensation layer over the interdigital transducer electrode, the interdigital transducer electrode including a lower layer, an upper layer, and a buffer layer disposed between the lower layer and the upper layer, a first modulus of elasticity of the buffer layer being less than a second modulus of elasticity of the upper layer, the buffer layer configured to release stress between the lower layer and the upper layer caused due to a difference between a first coefficient of thermal expansion of the lower layer and a second coefficient of thermal expansion of the upper layer.

13. The radio frequency module of claim 12 wherein the buffer layer has a third coefficient of thermal expansion that is less than the second coefficient of thermal expansion of the upper layer.

14. The radio frequency module of claim 13 wherein the third coefficient of thermal expansion of the buffer layer is larger than the first coefficient of thermal expansion of the lower layer.

15. The radio frequency module of claim 12 wherein the buffer layer includes titanium (Ti).

16. The radio frequency module of claim 12 wherein the upper layer includes at least one of aluminium (Al), copper (Cu), silver (Ag), and gold (Au), and the lower layer includes at least one of molybdenum (Mo), tungsten (W), and platinum (Pt).

17. The radio frequency module of claim 12 wherein a thickness of the buffer layer is more than 20 nm and less than 1000 nm.

18. A mobile device comprising:
an antenna configured to receive a radio frequency signal; and
a front end system configured to communicate with the antenna, the front end system including an acoustic wave device including a substrate, an interdigital transducer electrode disposed on the substrate, and a temperature compensation layer, the interdigital transducer electrode including a lower layer, an upper layer, and a buffer layer disposed between the lower layer and the upper layer, a first modulus of elasticity of the buffer layer being less than a second modulus of elasticity of the upper layer, the buffer layer configured to release stress between the lower layer and the upper layer caused due to a difference between a first coefficient of thermal expansion of the lower layer and a second coefficient of thermal expansion of the upper layer.

19. The mobile device of claim 18 wherein the first modulus of elasticity of the buffer layer is less than a third modulus of elasticity of the lower layer.

20. The mobile device of claim 18 wherein the buffer layer has a third coefficient of thermal expansion that is less than the second coefficient of thermal expansion of the upper layer.

* * * * *